United States Patent [19]

Lynch

[11] 3,725,991

[45] Apr. 10, 1973

[54] CIRCUIT BOARD TOOL

[76] Inventor: Leonard J. Lynch, 939 South Seventh Street, Dekalb, Ill. 60115

[22] Filed: Oct. 26, 1971

[21] Appl. No.: 192,086

[52] U.S. Cl. ..................................... 29/203 H
[51] Int. Cl. ..................................... H01r 43/00
[58] Field of Search .................. 29/203 H, 203 P, 29/203 B, 203 R, 203 D

[56] References Cited

UNITED STATES PATENTS

| | | | |
|---|---|---|---|
| 2,907,241 | 10/1959 | Lazar | 29/203 H |
| 2,976,608 | 3/1961 | Busler | 29/254 |
| 3,010,193 | 11/1961 | Croall, Jr. et al. | 29/278 |

*Primary Examiner*—Thomas H. Eager
*Attorney*—Andrew F. Wintercorn

[57] ABSTRACT

This circuit board tool is designed to hold many different outlines of transistors, resistors and capacitors and not only enables removal of such components from a cluster of closely spaced components, being only approximately 0.028 inches over the dimensions of the component, but acts as a heat transfer radiator or heat sink in a soldering operation. When the tool is clamped in place, both hands of the operator are free to solder or unsolder leads, and with the tool still holding the component, a slight pull on the tool will remove the component when the leads are free. Diametrically opposed slots between the jaws on the one end of the tool allow wire terminals of the component to extend outwardly for soldering or unsoldering while the jaws grip the component, being forced against the component by a sleeve that slides over a taper near the jaws to move the jaws together. A knob of heat-resistant insulating material on the other end of the tool retains the slidable sleeve in place and limits its travel, while providing a good grip.

10 Claims, 4 Drawing Figures

INVENTOR:
LEONARD J. LYNCH

Andrew F. Vintercorn (signature)
Attorney

CIRCUIT BOARD TOOL

This invention relates to circuit board tools and more particularly relates to a circuit board tool for holding electrical components while work is performed on them and while moving them from place to place.

In working with certain electrical components, such as when soldering or unsoldering the leads of transistors, capacitors, resistors and the like, it is common practice to hold the component with a pair of long nose pliers or tweezers while the operation is performed. This technique has several disadvantages such as: (1) it requires the operator to use one hand to hold the tweezers or pliers; (2) it is difficult to clamp the component with tweezers or pliers when the component is located within a cluster of closely spaced parts; and (3) under some circumstances, the component becomes overheated from the heat imparted to the leads during a soldering or unsoldering operation.

Accordingly it is an object of this invention to provide a novel circuit board tool.

It is a further object of the invention to provide a novel apparatus for holding components upon which work is to be done.

It is a still further object of the invention to provide a simple and inexpensive circuit board tool.

It is a still further object of the invention to provide a circuit board tool that protects the component from damage while being worked on.

It is a still further object of the invention to provide an electrical component clamping device that serves as a heat sink to protect the component from overheating.

It is a still further object of the invention to provide an electrical component clamping device that is able to clamp components that are in a cluster of closely spaced components.

In accordance with the above and further objects of the invention, a circuit board tool for removing from and replacing in a circuit electrical components such as resistors, transistors, capacitors and the like includes a metal cylindrical tube serving as a central shank having on one end a handle or knob of heat-resistant, heat-insulative plastic and having on the other end a metal socket formed integrally with the shank and connected thereto by a taper, with the socket and the portion of the shank near the socket including two diametrically opposed slots separating two jaws in the socket to grasp the components while the leads of the components extend through the slots. A slidable cylindrical sleeve fits tightly around the shank to press the jaws together about the component when engaging the taper and to release the component when near the handle, with the friction between the sleeve and the shank being sufficient to prevent the sleeve from slipping unless it is moved by the operator.

The circuit board tool has several advantages such as: (1) it is able to remove a component from a cluster of closely spaced components because the socket of the tool is only 0.028 inches larger than the component to be handled by the tool; (2) it serves as a heat sink for the component to permit heat conducted by the leads of the component to be radiated from the walls of the tool without damaging the component, thus permitting full attention to be given to the operation being performed; (3) it permits the component and circuit board tool to be clamped in place so as to free the hands of the operator; (4) it is easy to operate; and (5) it is inexpensive. Moreover, it may be used in experimental work in which overload of a component is possible to serve as a heat sink and thus permit full attention to be given to other matters rather than to observing the temperature of the component.

The above noted and other features of the invention will be better understood from the following detailed description when considered with reference to the accompanying drawings in which.

Figure 1:
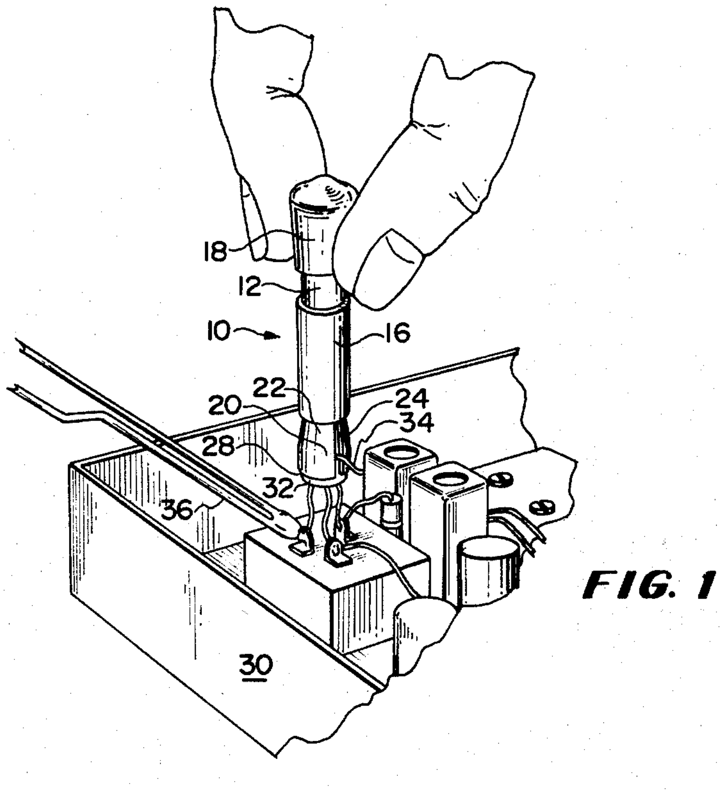
FIG. 1 is a perspective view of a circuit board tool in accordance with an embodiment of the invention, positioned for use in soldering or unsoldering a component in a circuit board.

In FIG. 1, there is shown a circuit board tool 10 having an elongated cylindrical tubular shank 12 with a shorter cylindrical grip-adjustment sleeve 16 positioned around its central portion, a plastic handle 18 at one end and a socket 20 at the other end, the grip-adjustment sleeve 16 being slidable on the shank between the handle 18 and the socket 20 which retain it on the shank. The socket 20 is integrally formed with the shank 12 and, being a larger cylindrical tube, is joined to the shank 12 by a tapered portion 22 of the tubular wall. Two diametrically opposed slots 24 and 26 (slot 24 being shown in FIG. 1 and slot 26 being shown in FIG. 2) extend longitudinally in the tubular walls from the open end 28 of the socket 20 to a portion of the shank 12 that is relatively near to the handle 18, forming two oppositely disposed jaws of the socket 20 from the separated wall portions, which are of spring steel to cause them to return to an open position after being compressed together.

As shown in FIG. 1, the circuit board tool 10 is held by the plastic handle 18 above a circuit 30 with the socket 20 positioned adjacent to the circuit board. Within the socket 20 is an electrical component 32 such as a transistor, resistor, capacitor or the like, with the lead wire or wires of the electrical component extending through the slots 24 and 26, one lead wire 34 of the component 32 being shown in FIG. 1 extending through the slot 24. With the component 32 held by the circuit board tool 10 as shown in FIG. 1, the component is worked upon, a soldering iron tip 36 being shown in FIG. 1 in position to unsolder the lead wires of the component so that it can be removed as one example of such work.

Figure 2:
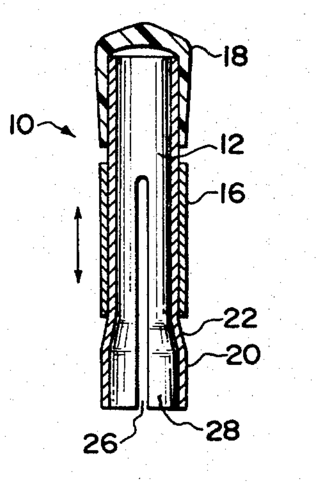
FIG. 2 is a longitudinal sectional view of the circuit board tool shown in FIG. 1.

As best shown in the sectional view of FIG. 2, the sleeve 16 is slidable upon the shank 12 of the circuit board tool 10 between an upper or releasing position in which the sleeve does not fit over the tapered portion 22 and a lower or clamping position in which the lower end of the sleeve fits over the tapered portion 22 to compress the jaws of the socket 20 together. When the sleeve 16 is in the lower or clamping position, the body of the component is held within the socket 20 by the jaws of the socket 20 with the leads extending through the slots 24 and 26. The sleeve 16 fits around the shank 12 tightly so that it is held in position by friction unless moved by the operator.

In the preferred embodiment, the walls of the shank 12, the socket 20, and the sleeve 16 are formed of a good heat conducting metal such as steel to permit the heat from a soldering operation to be conducted away from the leads, thus preventing the component from being overheated, and the handle 18 is formed of a heat-resistant material with a low coefficient of thermal conductivity to protect the hand of the user from excessive heat. However, other materials can be used if needed for special purposes.

Although the socket 20 is cylindrical in the circuit board tool 10, other shapes of sockets such as sockets having square or rectangular cross sections are possible for tools constructed in accordance with the invention to hold differently shaped components. The size of the opening 28 in the socket 20 is selected to be approximately 0.028 inches over the size of the component when the sleeve is in its upper or releasing position. With this construction, seven such tools will accommodate over twenty five outlines of transistors or condensors.

In use, the circuit board tool 10 holds a component in position while work is done upon it, such as the soldering and unsoldering of leads. To solder a component into a circuit, the operator clamps the component in the socket 20 of the tool 10, moves it into position and holds it with the tool 10 while the leads are soldered to the appropriate terminals on the circuit board. To remove a component from a circuit, the component is clamped in the socket 20 of the tool 10, which holds it while the leads are unsoldered and the component is removed from the circuit board.

Figure 3:
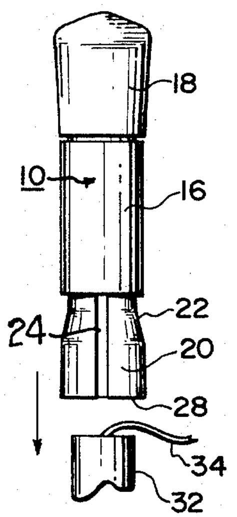
FIG. 3 is an elevational view of the circuit board tool just prior to clamping a component.
Figure 4:
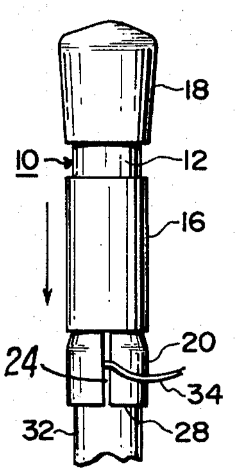
FIG. 4 is an elevational view of the circuit board tool after it has clamped the component.

To clamp a component, a circuit board tool 10 of the proper size and shape is first selected. The selected circuit board tool has an open end 28 in its socket 20 that conforms in shape to and is slightly larger in size than the component, being approximately 0.028 inches larger in diameter when the sleeve 16 of the circuit board tool is in its releasing position. While the sleeve 16 is in its releasing position as shown in FIG. 3, the circuit board tool is positioned with the open end 28 receiving the body of the component and with the leads of the component extending through the slots 24 and 26 in the walls of the socket. With the circuit board tool in this position, the sleeve 16 is moved from its releasing position to its clamping position as shown in FIG. 4.

As the sleeve 16 moves into its clamping position, it engages the tapered portion 22 of the wall of the circuit board tool 10 and forces the jaws of the socket 20 together to reduce the size of the slots 24 and 26 and of the open end 28 of the socket 20 until the body of the component is held securely in the socket 20. Because of the close fit of the sleeve 16 over the shank 12 of the circuit board tool 10, it remains in the clamping position to hold the component until the operator of the circuit board tool moves it into the releasing position.

While the component is being worked upon, the circuit board tool is held with one hand by the operator or is clamped in place, the latter alternative freeing both hands of the operator to work upon the component. Heat that is conducted along the leads from a soldering or unsoldering operation or the like is conducted through the metal wall of the circuit board tool, which serves as a heat sink to prevent the body of the component from being overheated.

To release the component from the circuit board tool 10 after it has been removed from a circuit or after it has been soldered into a circuit, the sleeve 16 is moved from its clamping position over the tapered portion 22 into its releasing position near the handle 18. When the sleeve is in its releasing position, the wall of the socket 20 and the slots 24 and 26 are spread to normal distances apart and the component is no longer clamped in the circuit board tool.

From the above description, it can be understood that the circuit board tool of this invention has several advantages such as: (1) it includes only a few inexpensive parts, being formed from two tubes and a plastic knob; (2) it is easily assembled with the slidable sleeve being held between the handle 18 and the socket 20; (3) it acts as a heat sink to prevent a component from being overheated while it is being worked upon, such as when its lead wires are being soldered or unsoldered or when it is being used in an experimental circuit where it may be overloaded; (4) it can clamp the ends of cylindrical components having end leads such as resistors by permitting the leads to extend through one of the slots 24 or 26; (5) it can be clamped in place to hold the component at a selected location, freeing both hands of the operator for other purposes; and (6) it can remove a component from a cluster of closely spaced components because it is only slightly larger than the component itself.

Although a preferred embodiment of the invention has been described with a certain degree of particularity, modifications and variations in the above description are possible without deviating from the invention. It is therefore to be understood that, within the scope of the appended claims, the invention may be practised otherwise than as specifically described.

What is claimed is:

1. A tool for holding an electronic component having at least one lead wire, comprising

- a socket having internal walls defining a first opening to receive said component;
- at least a portion of said walls conforming in shape to at least a portion of said component;
- said walls including a second opening transverse to said first opening to receive said lead wire;
- means for moving said walls toward and away from each other, whereby said socket clamps and releases said component;
- a shank having a first and a second end; and
- a handle;
- said socket being mounted to said first end and said handle being mounted to said second end of said shank.

2. A tool according to claim 1 in which said socket is formed of material having a high thermal conductivity, whereby said tool serves as a heat sink for said component.

3. A tool according to claim 1 in which said means for moving said walls includes:

- a tubular sleeve slidably mounted around said shank; and
- a tapered portion of said shank in the line of motion of said sleeve, whereby said walls are moved toward each other as said sleeve is moved over said tapered portion and are moved away from each other as said sleeve is moved away from said tapered portion.

4. A tool for holding an electronic component having at least one lead wire, comprising:

a socket having internal walls defining a first opening to receive said component;

at least a portion of said walls conforming in shape to at least a portion of said component;

said walls including a second opening transverse to said first opening to receive said lead wire;

means for moving said walls toward and away from each other, whereby said socket clamps and releases said component;

an elongated shank having a first end and a second end; and a handle formed of a heat resistant material having a low coefficient of thermal conductivity;

said socket being mounted to said first end and said handle being mounted to said second end of said shank.

5. A tool according to claim 4 in which said means for moving said tool includes:

a tubular sleeve slidably mounted about said shank; and a tapered portion of said socket joining said socket to said shank, whereby said side walls are moved toward each other as said sleeve is moved over said tapered portion and are moved away form each other as said sleeve is moved away from said tapered portion.

6. A tool according to claim 5 in which said shank and sockets are formed integrally of metal, whereby said tool serves as a heat sink for said component, and said shank has tubular walls that extend from the walls of said socket.

7. A tool according to claim 6 in which said socket includes a third opening; said second and third openings being two diametrically opposed slots in the walls of said shank and socket; said slots defining two jaws in said socket; and said slots being sufficiently wide to permit lead wipes to pass.

8. A tool according to claim 7 in which said first opening is cylindrical, whereby said tool may hold components having a cylindrical portion.

9. A tool according to claim 7 in which said first opening has a square cross section.

10. A tool according to claim 7 in which said first opening has a rectangular cross section.

* * * * *